US009871604B2

(12) United States Patent
Terada et al.

(10) Patent No.: US 9,871,604 B2
(45) Date of Patent: Jan. 16, 2018

(54) ALLOCATION TO CHANNEL STRIPS IN AUDIO SIGNAL PROCESSING APPARATUS

(71) Applicant: YAMAHA CORPORATION, Hamamatsu-shi, Shizuoka-Ken (JP)

(72) Inventors: Kotaro Terada, Hamamatsu (JP); Shunichi Kamiya, Hamamatsu (JP)

(73) Assignee: YAMAHA CORPORATION, Hamamatsu-shi (JP)

( * ) Notice: Subject to any disclaimer, the term of this patent is extended or adjusted under 35 U.S.C. 154(b) by 0 days.

(21) Appl. No.: 15/078,058

(22) Filed: Mar. 23, 2016

(65) Prior Publication Data

US 2016/0285573 A1 Sep. 29, 2016

(30) Foreign Application Priority Data

Mar. 24, 2015 (JP) ................................ 2015-061639

(51) Int. Cl.
*H04N 1/00* (2006.01)
*H04H 60/04* (2008.01)
*H03G 3/00* (2006.01)

(52) U.S. Cl.
CPC .................................. *H04H 60/04* (2013.01)

(58) Field of Classification Search
CPC ...... H04H 60/04; H04R 5/04; H04R 2430/01; H04R 2430/03; H04R 3/04; H04R 3/00; H04R 2420/01; G06F 3/04847; H04S 1/007; H04S 7/00; H04S 7/307; H04S 2400/13; H04S 2400/15; H04S 3/00; H04S 7/30
USPC .... 381/119, 109, 123, 102, 104, 61; 700/94; 84/625, 660, 424, 645, 697
See application file for complete search history.

(56) References Cited

U.S. PATENT DOCUMENTS

2009/0028359 A1* 1/2009 Terada et al. ............. H04S 7/00
381/119

FOREIGN PATENT DOCUMENTS

JP 2011066863 * 3/2011
JP 2011066863 A 3/2011

OTHER PUBLICATIONS

"Yamaha Digital Mixing Console PM5D, Digital Mixing System DSP5D, PM5D/PM5D-RH V2 DSP5D, Owner'S Manual" published in 2004 by Yamaha Corporation. 409 pages.

(Continued)

*Primary Examiner* — Norman Yu
(74) *Attorney, Agent, or Firm* — Rossi, Kimms & McDowell LLP

(57) ABSTRACT

A mixer includes a plurality of channel strips to which are variably allocated respective objects of operation, and a memory of the mixer stores layer data comprising information that, for each of the channel strips, designates a channel or a channel group as an object of operation of the channel strip, or designates the channel strip as a deploying channel strip for individually deploying thereto any one of the channels belonging to a given group. When objects of operation are to be allocated to the individual channel strips, no channel or group is allocated to each deploying channel strip, and a setting is made to the effect that the channel strip is to be used for a channel deploying purpose. In response to a deploying instruction of a given group, individual channels belonging to the given group are deployed to the deploying channel strips.

7 Claims, 4 Drawing Sheets

(56) References Cited

OTHER PUBLICATIONS

"Digital Mixing Console M7CL" published in 2005 by Yamaha Corporation. 282 pages.

* cited by examiner

ALLOCATION TO CHANNEL STRIPS IN AUDIO SIGNAL PROCESSING APPARATUS

BACKGROUND

The present invention relates generally to audio signal processing apparatus constructed to allocate desired channels or channel groups to a plurality of channel strips provided on an operation panel, and more particularly to an improvement in techniques for individually allocating each channel, belonging to a channel group, to a channel strip.

As well known in the art, the digital audio mixing consoles (hereinafter sometimes referred to simply as "mixers") include, on an operation panel, a plurality of channel strips each having a plurality of manual operators (manual operating members), such as a fader, an encoder and various buttons. A desired object of operation, such as one channel, is allocated to each of the channel strips, and a value of a desired parameter of the allocated object of operation is adjusted by use of any one of the manual operators of the channel strip. The mixer disclosed in an instruction manual "YAMAHA DIGITAL MIXING CONSOLE PM5D/PM5DRH" published in 2004 by Yamaha Corporation and available from the Internet at URL:http://www2. yamaha-.co.jp/manual/pdf/pa/japan/mixers/cs1d_ja_om_r21.pdf?_ga=1.18964 9067.145683692.1426226024 (hereinafter referred to as "Non-patent Literature 1") has a layer function for collectively switching objects of operation to be allocated to the plurality of channel strips so that many objects of operation can be controlled efficiently with a limited number of the channel strips (see "Chapter 4 . Fundamental Operation of Input Channels" at pages 32 and 33 of Non-patent Literature 1).

There has also been known a grouping function for grouping a plurality of channels into a channel group (hereinafter also referred to simply as "group") and collectively controlling individual channels belonging to the group (see, for example, Non-patent Literature 1 identified above, and Non-patent Literature 2 that is an instruction manual "DIGITAL MIXING CONSOLE M7CL" published in 2005 by Yamaha Corporation and available from the Internet at URL: http://www2.yamaha.co.jp/manual/pdf/pa/japan/mixers/m7cl_ja_om_e0.pdf?_ga=1.261478797.1 45683692.1426226024). For example, level adjustment and mote-ON/OFF can be performed collectively, by means of a single group fader operator, on individual channels belonging to one group (see "Chapter 7 DCA Group/Mute Group" at pages 92 to 98 of Non-patent Literature 1 , and "Chapter 11 Grouping/Link" at pages 113 to 121 of Non-patent Literature 2). Further, pages 120 and 121 of Non-patent Literature 2 discloses a channel link function for causing a desired parameter to be interlinked among a plurality of channels belonging to a group.

Although the above-mentioned grouping function for grouping a plurality of channels into a group and collectively operating the channels belonging to the group by means of a single manual operator is convenient, a user may sometimes want to operate the channels of the group individually or independently of one another. Therefore, a digital mixer has been proposed and known which can deploy individual channels constituting (belonging to) a group to channel strips through a predetermined operation. Japanese Patent Application Laid-open Publication No. 2011-066863 (hereinafter referred to as "Patent Literature 1") discloses, as a technique for flexibly designating deployed-to (or deploying or deployment-destination) channel strips, dividing a plurality of channel strips on an operation panel into a plurality of blocks and designating any one of the blocks as a deployment destination so that individual channels constituting a group can be deployed to the channel strips belonging to the designated block.

However, the deployment function disclosed in Patent Literature 1 , which is arranged such that any one of the blocks, each comprising a plurality of channel strips, is designated as a deployment destination, is premised on a large-scale mixer including a plurality of the blocks on an operation panel. Thus, in applying the scheme disclosed in Patent Literature 1 , there would be encountered many limitations on physical structural conditions of mixers. Namely, this scheme is not suited for mixers where channel strips cannot be managed divided in a plurality of blocks, or are not suited to be managed divided in a plurality of blocks, such as a small-scale mixer where the number of channel strips on the operation panel is small.

Further, according to the deployment function disclosed in Patent Literature 1 , which of the blocks should be designated as deployment destinations is fixedly preset by an administrator. More specifically, such administrator's settings designate, individually for the blocks, which blocks should be used as deployment destinations and in which order, or which blocks should not be used as deployment destinations. The blocks which a user wants to use as deployment destinations may differ, for example, depending on a scene of use of the mixer. However, with the conventionally-known technique, when the blocks that should become deployment destinations are to be changed to other blocks, e.g. each time the scene of use of the mixer changes, the user has to re-designate blocks as deployment destinations. Namely, the user has to perform the re-designating operations individually for the plurality of blocks, which is very troublesome and laborious.

Further, with the deployment function disclosed in Patent Literature 1 , it is possible that, before the user gives a deploying instruction, each of the channel strips of a block designated as a deployment destination may have some channel or group already allocated thereto as an object of operation. In such a case, the channel or group already allocated to each of the channel strips of the deployment-destination block would disappear from the operation panel although the user has merely instructed deployment of a group. Such disappearance may bother the user or act against intention of the user.

SUMMARY OF THE INVENTION

In view of the foregoing prior art problems, it is an object of the present invention to provide an improved audio signal processing apparatus which, in deploying individual channels belonging to a given group to channel strips, can flexibly designate the channel strips that should be used as deployment destinations.

In order to accomplish the above-mentioned object, the present invention provides an improved audio signal processing apparatus for performing signal processing on audio signals input to a plurality of channels, which comprises: a plurality of channel strips, each of the channel strips including at least one manual operator for adjusting a parameter value of signal processing to be performed on one of the channels or a group of two or more of the channels allocated to the channel strip as an object of operation; a memory storing object-of-operation designation information that designates objects of operation to be allocated to individual ones of the plurality of channel strips, wherein, for each of the channel strips, the object-of-operation designation information designates the channel or the group as the object of operation of the channel strip, or designates the channel strip as a deploying channel strip for individually deploying thereto any one of the channels belonging to the group; a storage medium storing a program; and a processor for executing the program, the processor, when executing the program, being configured to: based on the object-of-operation designation information stored in the memory, allocate, to the plurality of channel strips, the channels or the group designated as the objects of operation, wherein the processor allocates none of the channels or group to the channel strip designated as the deploying channel strip and makes a setting to the effect that the channel strip is to be used as the deploying channel strip; and in response to a deploying instruction of a given group, allocate individual channels belonging to the given group to the channel strips designated as the deploying channel strips.

The object-of-operation designation information includes information designating which of the channel strips is to be used as a deploying channel strip, and thus, when objects of operation are to be allocated to the plurality of channel strips, a setting is made, for each channel strip designated as the deploying channel strip, to the effect that that channel strip is to be used for a group deployment purpose, and such a deploying channel strip is left empty without any channel or group being allocated thereto. In this manner, deploying channel strips can be secured. Thus, once a deploying instruction of a given group is received, individual channels belonging to the given group is allocated to the channel strips designated as deploying channel strips. The construction where a group deployment destination is designated on a per-channel-strip basis in the present invention permits more flexible selection or designation of a channel strip that should become (should be used as) a group deployment destination than the conventionally-known construction where a group deployment destination is designated per block of a plurality of channel strips. Further, even a small-scale mixer, which is equipped with a group deploying function and in which a plurality of channel strips are not divided into blocks, has no substantial limitations on physical structural conditions and can achieve various advantageous benefits, such as the capability of appropriately implementing the group deploying function. Further, because each of the deploying channel strips is secured in an empty state without any channel or group being allocated thereto, it is possible to avoid the inconvenience or unexpected occurrence that a channel or group that were being operated disappears as channels of a group are deployed. Therefore, the present invention can advantageously prevent the group deployment from bothering a user and prevent object-of-operation allocation from being undesirably changed against intention of the user.

In an embodiment of the invention, the memory stores a plurality of pieces of the object-of-operation designation information, and based on a selected one the plurality of pieces of the object-of-operation designation information, the processor allocates, to the plurality of channel strips, the channels or the group designated as the objects of operation, but allocates none of the channels and the group to the channel strip designated as the deploying channel strip. By storing the plurality of pieces of the object-of-operation designation information, the present invention allows a user to readily change one or more channel strips which are to be designated as one or more group deployment destinations by merely switching between the plurality of pieces of the object-of-operation designation information.

In one embodiment of the invention, the processor, when executing the program, is configured to edit the object-of-operation designation information in response to a user's operation, and the memory may store the object-of-operation designation information having been edited in response to the user's operation. Thus, individually for each of the channel strips, it is possible to variably set whether or not the channel strip should be designated as a deploying channel strip. In this way, the present invention permits flexible selection or designation of a channel strip that should become a group deployment destination.

The present invention may be constructed and implemented not only as the apparatus invention discussed above but also as a method invention. Also, the present invention may be arranged and implemented as a software program for execution by a processor, such as a computer or DSP, as well as a non-transitory computer-readable storage medium storing such a software program.

The following will describe embodiments of the present invention, but it should be appreciated that the present invention is not limited to the described embodiments and various modifications of the invention are possible without departing from the basic principles. The scope of the present invention is therefore to be determined solely by the appended claims.

BRIEF DESCRIPTION OF THE DRAWINGS

Certain preferred embodiments of the present invention will hereinafter be described in detail, by way of example only, with reference to the accompanying drawings, in which.

DETAILED DESCRIPTION

Now, with reference to the accompanying drawings, a description will be given about an embodiment of an audio signal processing apparatus of the present invention which is applied to a mixing console. In the following description and drawings, the word "channel" will sometimes be referred to also as "CH".

Figure 1:
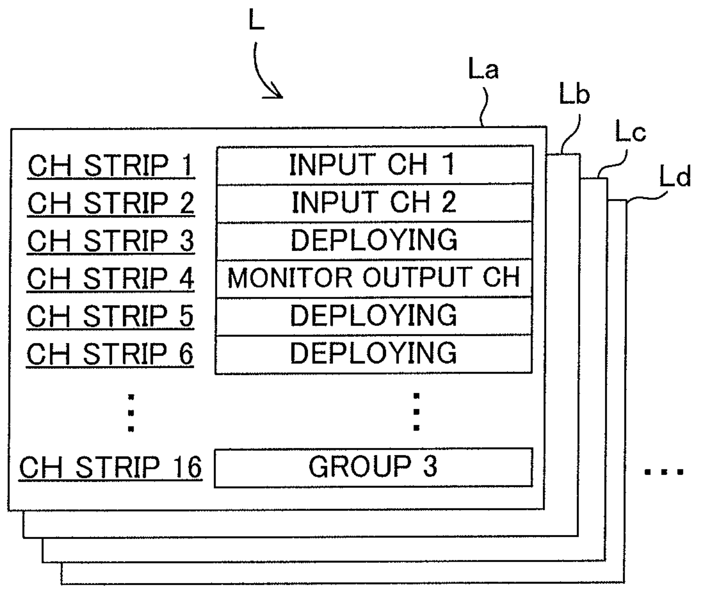
FIG. 1 is a diagram explanatory of an example structure of layer data stored in a storage section provided in a mixing console to which is applied an embodiment of an audio signal processing apparatus of the present invention.

FIG. 1 is a diagram explanatory of an example structure of layer data stored in a storage section 12 (FIG. 2) provided in a mixing console (also referred to as "mixer") to which is applied the embodiment of the audio signal processing apparatus of the present invention. The layer data are each object-of-operation designation information for designating objects of operation to be allocated respectively to channel strips 30 (FIG. 4) that will hereinafter be referred to also as "CH strips". The "CH strip" comprises a group of manual operators operable to adjust parameter values for use in signal processing on the object of operation allocated to the CH strip. To the CH strip is allocated one channel or one group (channel group) as the object of operation. Each group comprises a plurality of channels. By selecting any one of the layer data La, Lb, Lc, Ld, . . . , a user can collectively switch the objects of operation of the plurality of CH strips to other objects of operation on the basis of the selected layer data. Such collective switching of the objects of operation of the plurality of CH strips based on the layer data L is well known per se in the art. Further, in this specification, reference characters with suffix alphabetical letters and numerals like "1*a*", "1*b*", etc. are used where it is necessary to distinguish between or among a plurality of components or elements; however, reference characters with numerals alone, such as "1", are used where there is no need to distinguish between or among a plurality of components or elements.

One layer data L comprises information that designates channels or a group ("Input CH1", "Input CH2", "Monitor Output CH" and "Group 3" in FIG. 1) as objects of operation for individual ones of the plurality of CH strips (sixteen (16) CH strips from "CH Strip1" to "CH Strip16" in FIG. 1) or designates some CH strips as deploying CH strips ("Deploying" in the figure") for individually deploying thereto channels belonging to the group. In this specification, individually allocating a plurality of channels belonging to a group to CH strips will be referred to as "deploying". As will be detailed later, layer data L includes information designating which of the CH strips are to be used as deploying CH strips, and thus, when objects of operation are to be allocated to a plurality of CH strips, a setting is made to the effect that each of the CH strips designated as deploying CH strips be used for a "Deploying" purpose, and such a deploying CH strip is left empty without any channel or group being allocated thereto. Thus, once a deploying instruction of a given group (group deploying instruction) is received, individual channels belonging to the given group can be allocated to the CH strips designated as deploying CH strips.

Figure 2:
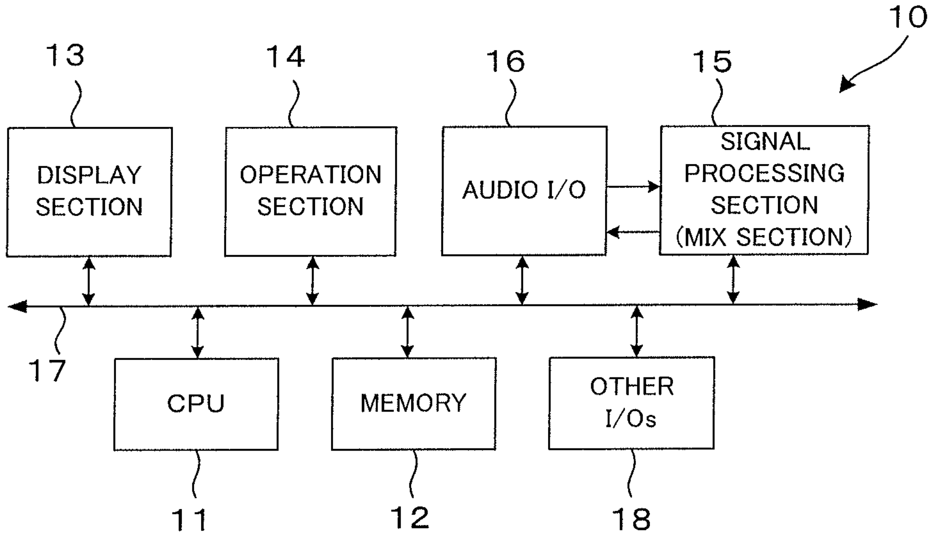
FIG. 2 is a block diagram showing an example electric hardware setup of the mixing console to which is applied the embodiment of the audio signal processing apparatus of the present invention.

FIG. 2 is a block diagram showing an example electric hardware setup of the mixer 10 to which is applied the embodiment of the audio signal processing apparatus of the present invention. The mixer 10 includes a central processing unit (CPU) 11, a memory 12, a display section 13, an operation section 14, a signal processing section (MIX section) 15, and an audio interface (audio I/P) 16. These components 11 to 16 are interconnected via a communication bus 17, so that various control signals can be communicated between the CPU 11 and the components 12 to 16. Further, the MIX section 15 can input or output analog or digital audio signals from or to input equipment, such as a microphone and a reproduction device, or output equipment, such as an amplifier and a speaker. The mixer 10 may further includes other I/Os 18, such as a USB interface.

The CPU 21 controls overall operation or behavior of the mixer 20 by executing various programs stored in the memory 12. The memory 12 not only non-volatilely stores various programs to be executed by the CPU 11 and various data to be referenced by the CPU 11, but also is used as a loading area for a program to be executed by the CPU 11 and as a working area for use by the CPU 11. The working area of the memory 12 stores, in association with the plurality of channels provided in the mixer 10, current values of parameters defining behavior of signal processing in the channels. The memory 12 may comprise a combination of various memory devices, such as a read-only memory (ROM), a random-access memory (RAM), a flash memory and a hard disk. This memory 12 includes a storage section storing a plurality of layer data La, Lb, Lc, Ld, . . . shown in FIG. 1.

The display section 13, which comprises a display 36 (FIG. 4), related interface circuitry, etc., displays various information, based on display control signals given from the CPU 11, in various images, character trains, etc. The operation section 14 includes groups of manual operators, including fader operators, provided in corresponding relation to the plurality of CH strips 30 (FIG. 4), various other manual operators 31 to 35 (FIG. 4), related interface circuitry, etc. A user or human operator performs various operations for setting and changing various parameters by use of various manual operators of the operation section 14. The CPU 11 acquires a detection signal corresponding to each operation, by the human operator, of the operation section 14 and controls the operation of the mixer 10 on the basis of the acquired detection signal.

The MIX section 15 comprises, for example, a signal processing device virtually implemented, for example, by a DSP (Digital Signal Processor), the CPU 11 and software stored in the memory 12. The MIX section 15 executes a signal processing program to perform signal processing on one or more audio signals supplied from not-shown input equipment and outputs the thus-processed audio signals to not-shown output equipment. The signal processing performed by the MIX section 15 includes mixing processing for mixing a plurality of audio signals, and this signal processing is controlled on the basis of current values of a plurality of parameters stored in the memory 12. Note that the MIX section 15 may be one externally connected via the other I/O 18 rather than the one provided internally in the mixer 10.

Figure 3:
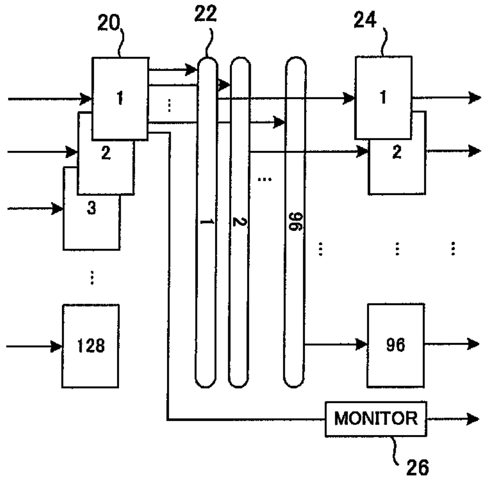
FIG. 3 is a block diagram explanatory of a construction for implementing a signal processing function of the mixing console shown in FIG. 2.

FIG. 3 is a block diagram explanatory of a construction for implementing the signal processing function of the mixer 10. Operation of each element shown in FIG. 3 is implemented solely through digital signal processing by the MIX section 15. The mixer 10 includes a plurality of input channels 20 (one hundred and twenty-eight (128) input channels from "Input CH1" to "Input CH128" in FIG. 3, of which only "Input CH1" is indicated by reference numeral 20 in the figure). The input channels 20 each receive an audio signal from a corresponding one of input ports (not shown), perform signal processing based on values of various parameters (signal processing parameters) of the channel, and selectively output the thus-processed audio signal to any one or more of MIX buses 22 (ninety-six (96) buses of bus No. "1" to "96" in FIG. 3, of which only the MIX bus of bus No. 1 is indicated by reference numeral 22 in the figure). Note that the audio signal processed in each of the input channels 20 may be output from the input channel 20 to all of the buses 22 or to only one or some of the buses 22. The mixer 10 also includes a plurality of output channels 24 (ninety-six (96) output channels from "Output CH1" to "Output CH96" in FIG. 3, of which only "Output CH1" is indicated by reference numeral 24 in the figure), and each of the output channels 24 is associated with any one of the MIX buses 22. Each of the output channels 24 performs signal processing, based on values of various channel-specific parameters, on the audio signal output from the associated or corresponding bus 22. Further, each of the input channels 20 and output channels 24 is connected to a monitor output channel 26 via a not-shown CUE/monitor bus so that it can selectively supply its audio signal to the monitor output channel 26. In FIG. 3, only a signal path from one of the input channels 20 to the monitor output channel 26 is shown, for convenience of illustration. The monitor output channel 26 performs, on the supplied audio signal, signal processing based on values of various parameters. The various signal processing performed by the individual channels 20, 24 and 26 includes, for example, tone volume level adjustment, equalizing, panning, impartment of various effects, etc. based on current values of various parameters stored in the memory 12.

Figure 4:
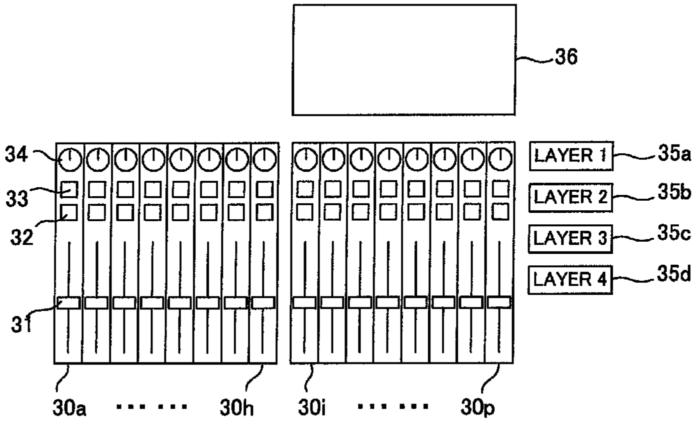
FIG. 4 is a block diagram showing an example construction of an operation panel of the mixing console shown in FIG. 2.

FIG. 4 shows an example construction of an operation panel of the mixer 10 which includes the plurality of CH strips (sixteen (16) CH strips in the illustrated example) 30*a* to 30*p* and the display 36 (display section 13 in FIG. 2). The 16 CH strips 30*a* to 30*p* correspond to "CH Strip 1" to "CH Strip 16" in layer data L shown in FIG. 1 and are identified by their respective unique CH strip Nos. Each of the CH strips 30 includes: the tone volume adjusting fader operator 31; a CUE switch 32 for switching between ON and OFF of output to the CUE/monitor bus; a SEL switch 33 for switching between ON and OFF of channel selection (SEL); and a knob type operator 34 capable of changing object-of operation allocation to the channel strip. Note that, in FIG. 4, reference numerals 31, 32, 33 and 34 are attached to the manual operators of the one CH strip 30 (CH Strip 30*a*).

The 16 CH strips 30*a* to 30*p* are constructed so that their respective objects of operation are collectively switchable to others in response to an object-of-operation switching instruction. Namely, the CH strips 30*a* to 30*p* in the mixer 10 are not divided into blocks unlike in the conventionally-known technique. In the instant embodiment, the instruction for switching the objects of operation of the individual CH strips 30*a* to 30*p* is given through a selective operation of any one of layer switches 35*a* to 35*d* provided on a right end portion of the operation panel in FIG. 4. As noted above, objects of operation to be allocated to the individual CH strips 30*a* to 30*p* are designated on the basis of the layer data L stored in the memory 12 (see FIG. 1). Each of the layer switches 35*a* to 35*d* is associated with any one of the layer data La, Lb, Lc, Ld, . . . . As an example, four layer data La, Lb, Lc, Ld fixedly corresponding to the four layer switches 35*a* to 35*d* are stored in the memory 12. As another example, one or more layer data La, Lb, Lc, Ld, . . . are prestored in the memory 12, and the user associates any desired one of the layer data L with each of the layer switches 35*a* to 35*d*.

Figure 5:
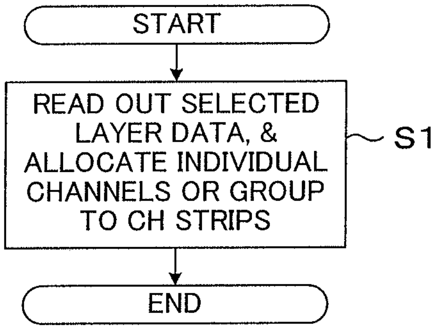
FIG. 5 is a flow chart showing an example of object-of-operation allocation processing.

FIG. 5 is a flow chart showing an example of object-of-operation allocation processing performed by the CPU 11 in response to an operation of the layer switch 35. Any one of the layer switches 35a to 35d is exclusively operated or selected (or turned on) by the user. Then, the CPU 11 reads out from the memory 12 the layer data L corresponding to the user-selected layer switch 35 and allocates channels or one or more groups to the individual CH strips 30a to 30p on the basis of the read-out layer data L, at step S1. However, at this step S1, the CPU 11 does not allocate any channel or group to each CH strip 30 designated as a deploying CH strip by the read-out layer data L and makes a setting to the effect that that designated CH strip is to be used as a deploying CH strip. Namely, at step S1, the CPU 11 writes, as information indicative of objects of operation of the individual CH strips 30a to 30p, information indicative of the channels or one or more groups designated by the layer data L or the setting to the effect that that designated CH strip is to be used for the "Deploying" purpose into allocation information stored in the memory 12. The allocation information is information identifying the objects of operation currently allocated to the individual CH strips 30a to 30p. The CH strip 30 designated as "Deploying" will be referred to as "deploying CH strip".

When the layer switch 35 corresponding to the layer data La of FIG. 1 is ON, for example, "Input CH1" is allocated to "CH Strip 1", "Input CH2" is allocated to "CH Strip 2", "Deploying" is allocated to "CH Strip 3", "Monitor Output CH" is allocated to "CH Strip 4", "Deploying" is allocated to "CH Strip 5", "Deploying" is allocated to "CH Strip 6", . . . , and "Group 3" is allocated to "CH Strip 16" in accordance with the layer data La. Because "Deploying" is allocated to some of the CH strips 30 with no channel or group allocated thereto as noted above, allocation destinations of individual channels to be deployed in response to a deploying instruction can be secured.

If one or more CH strips 30 differing among the layer data La, Lb, Lc, Ld, . . . corresponding to the layer switches 35*a* to 35*d* are set in advance to be used as deploying CH strips as above, it is possible to readily change the channel strips 30 to be used as deploying CH strips to others by merely performing an object-of-operation switching operation at step S1 of FIG. 5 in response to an operation of any one of the layer switches 35*a* to 35*d*. A combination of the CPU 11 and the operation of step S1 of FIG. 5 constitutes a first allocation section that allocates objects of operation to the plurality of channel strips, and that does not allocate any channel or group to each channel strip designated as the deploying channel and makes a setting such that the designated channel strip is used as the deploying channel strip.

The user can use the manual operators 31 to 34 of the individual CH strips 30*a* to 30*p* to change parameter values of signal processing on the channels or one or more groups allocated as objects of operation of the CH strips 30*a* to 30*p*. When the user has operated the fader operator 30 on the CH strip 30 (e.g., the left-end CH strip 30*a* in FIG. 4) having "Input CH1" allocated thereto as an object of operation, for example, the CPU 11 changes a tone volume level parameter value of "Input CH1", included in various parameter values stored in the memory 12, by an amount corresponding to the operation on the CH strip 30.

Further, when the user has operated any one of the manual operators 31 to 34 on any one of the CH strips 30 set for the "Deploying" purpose and if no channel belonging to a group is currently allocated or deployed to that CH strip 30, the user's operation of the operator is ignored. Namely, in this case, the CPU 11 does not change any parameter value of that CH strip 30. Because, no channel or group is currently allocated or deployed as an object of operation to the CH strip 30 set for the "Deploying" purpose unless channels belonging to a group are deployed to that CH strip 30.

When the user has operated any one of the manual operators on some of the CH strips 30 having a given group allocated thereto as an object of operation, on the other hand, the CPU 11 controls parameter values, corresponding to the operated manual operator, in individual channels belonging to the given group collectively in an interlinked fashion. Such a function for grouping a plurality of channels and collectively controlling the grouped channels in an interlinked fashion is well known in the art as a grouping function. The grouping function will be explained briefly below. Namely, according to the grouping function, the user can select a plurality of desired input channels 20 or a plurality of desired output channels 24 to create a group of the selected channels. Information identifying a plurality of such groups can be stored in memory. The individual groups are identifiable by unique group Nos. or names, such as "Group 1", "Group 2", "Group 3", . . . .

In response a user's operation of any one of the manual operators 31 to 34 of a CH strip 30 having a given group allocated thereto as an object of operation, the CPU 11 identifies individual channels belonging to the given group allocated to that CH strip 30 and collectively changes, by an amount corresponding to the user's operation of the one manual operator, parameter values corresponding to the operated manual operator from among various parameter values stored in the memory 12 in relation to the signal processing of the identified channels. In a case where individual channels belonging to "Group 3" allocated to "CH Strip 16" are eight channels, i.e. Input CH9 to Input CH16 and if the fader operator 31 of "CH Strip 16" has been operated, tone volume level values of "Input CH9" to "Input CH16" are collectively changed in accordance with the operation of the fader operator 31 of "CH Strip 16". In this case, the parameter values of the individual channels belonging to the group can be collectively controlled in an interlinked fashion with the single fader operator 31 while maintaining tone volume level differences among "Input CH9" to "Input CH16".

Although such a function for grouping a plurality of channels and collectively controlling individual channels of the group in an interlinked fashion is convenient, the user may sometimes want to operate the plurality of channels of (or constituting) the group individually channel by channel. Therefore, the mixer 10 is equipped with a novel deployment function for deploying individual channels belonging to a group to a plurality of CH strips 30 and allowing the deployed channels to be operated individually channel by channel.

Figure 6:
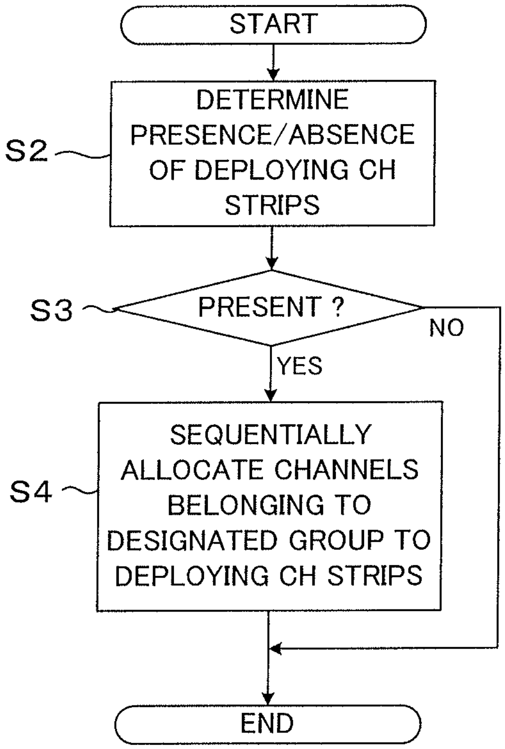
FIG. 6 is a flow chart showing an example of a group deployment process.

As an example, the mixer 10 is constructed to receive a deploying instruction for each of groups allocated as objects of operation of CH Strips 30*a* to 30*p* . For example, by operating the SEL switch 33 of any one of the CH strips 30*a* to 30*p* which has a given group allocated thereto, the user can input a deploying instruction of that group. FIG. 6 is a flow chart showing an example of a deployment process performed by the CPU 11 in response to a deploying instruction. At step S2, the CPU determines, on the basis of the allocation information stored in the memory 12, whether there is any currently unused deploying CH strip 30 among the CH strips 30*a* to 30*p* . The "currently unused deploying CH strip 30" is a channel strip that is not currently used as a deployment destination of any one of channels of a group.

If there are unused deploying CH strips 30 ("YES" determination at step S3), the CPU 11 sequentially allocates individual channels belonging to the group, designated by the current deploying instruction (deployment-instructed group), to the unused deploying CH strips 30. As an example, the CPU 11 determines, at step S2 above, whether there are a sufficient number of currently-unused deploying CH strips 30 for the total number of channels constituting the deployment-instructed group. If there are a sufficient number of currently-unused deploying CH strips 30 for the total number of channels constituting the deployment-instructed group ("YES" determination at step S3), then the CPU 11 proceeds to step S4. The allocation of the channels may be performed in any desired order, e.g. in an increasing order of the channel Nos. such that the channel of the smallest channel No. is allocated to the CH strip 30 of the smallest CH strip No. and so on. Alternatively, the user may set a desired position in the allocation order per deploying CH strip 30. Following step S4, the CPU 11 terminates the deployment process. Because each deploying CH strip 30 is secured in advance as an empty channel strip before it is used as a deployment destination, it is possible to avoid an inconvenience or unexpected occurrence that a channel or group that were being operated in the CH strip 30 disappears in response to execution of the deploying instruction. Here, a combination of the CPU 11 and the operation of step S4 of FIG. 6 constitutes a second allocation section that, in response to a deploying instruction of a given group (deployment-instructed group), allocates individual channels belonging to the deployment-instructed group to the channel strips designated as the deploying channel strips by the object-of-operation designation information.

If, on the other hand, there is no deploying CH strip (NO determination at step S3), the CPU 11 terminates the deployment process of FIG. 6. At that time, the CPU 11 may notify the user that no channel deployment can be performed, for example, through a visual display by the display 36. As an example, if the number of currently unused deploying CH strips is insufficient, the CPU branches to a "NO" branch so that the operation of step S4 is not performed. As another example, even when the number of currently unused deploying CH strips is insufficient, the CPU 11 may perform an operation for allocating only one or some of the channels belonging to the group to the currently unused deploying CH strip or strips 30 step S4.

After the channels belonging to the group have been allocated to the currently unused deploying CH strips 30 as above, the CPU 11 can change, in response to a user's operation of any one of the manual operators 31 to 34 on any one of the deploying CH strips 30, a corresponding parameter value for use in the signal processing on the channel deployed to that one deploying CH strip 30. For example, when the fader operator 31 has been operated on the deploying CH strip 30 having a channel belonging to a given group allocated thereto, the CPU 11 changes a tone volume level parameter value of the channel, allocated to the deploying CH strip 30, from among parameter values stored in the memory 12, by an amount corresponding to the operation of the fader operator 31.

Figure 7:
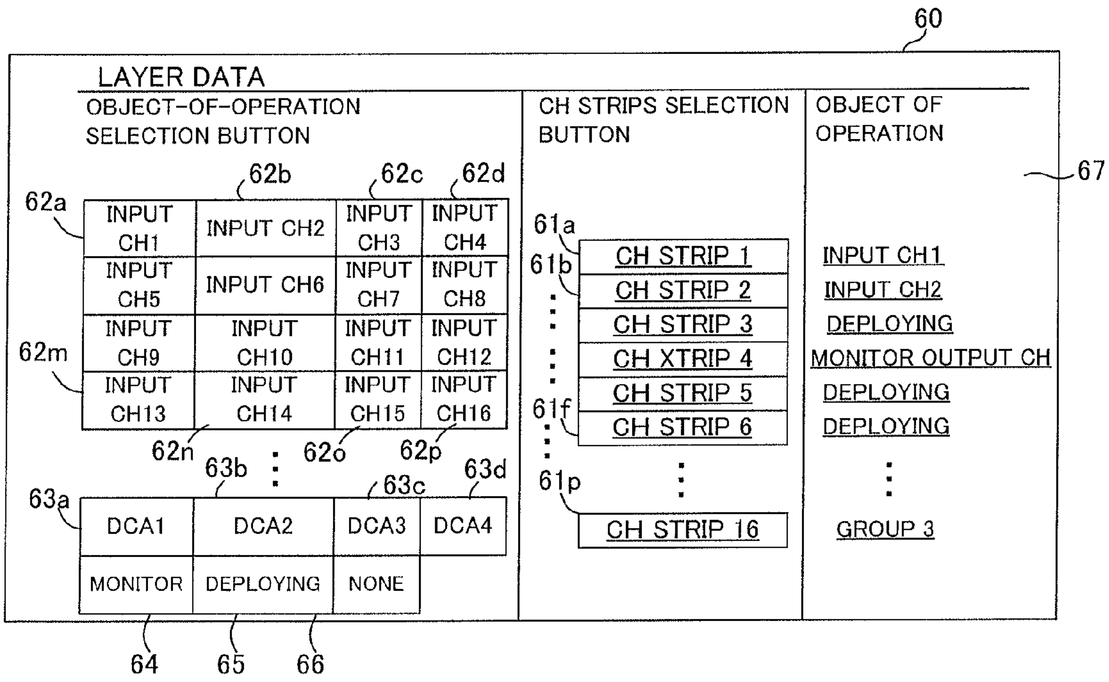
FIG. 7 is a diagram showing an example of a layer data editing screen.

The user can edit as desired the content of each of the layer data stored in the memory 12, i.e. what should be allocated to the individual CH strips 30 as objects of operation of the CH strips 30. FIG. 7 shows an example of a layer data editing screen displayed on the display 36, as an example means for editing the layer data L. The user selects a desired one of the plurality of layer data La, Lb, Lc, Ld, . . . as an object of editing and inputs an editing instruction. In response to the user's editing instruction, the CPU 11 displays, on the display 36, the layer data editing screen 60 related to the layer data L selected by the user as the object of editing.

A plurality of CH strip selection buttons 61*a* to 61*p* ("CH Strip 1" to "CH STRIP 16" in the figure) are button images which are provided centrally on the layer data editing screen 60 in corresponding relation to the CH strips 30*a* to 30*p* (FIG. 4) provided on the operation pane, and which are each operable to select the corresponding CH strip 30 as an object of editing.

To the left of the CH strip selection buttons 61*a* to 61*p* are displayed, as button images for selecting objects of operation of the CH strips 30: buttons 62*a* , 62*b* , 62*c* , . . . ("Input CH1" to "Input CH16" in FIG. 7) each operable to select an input channel 20; a button (not shown) operable to designate an output channel 24 as an object of operation of a CH strip 30; buttons 63*a* , 63*b* , 63*c* , . . . ("DCA1" to "DCA5" in the figure) each operable to designate a group as an object of operation of a CH strip 30; a button 64 ("Monitor" in the figure) operable to designate the monitor output channel 26 as an object of operation of a CH strip 30; a button 65

("Deploying" in the figure) operable to designate a CH strip 30 as a deploying CH strip; and a button 66 ("None" in the figure) instructing that nothing should be allocated to a CH strip 30.

In an object-of-operation display section 67, objects of operation allocated to the individual CH strips 30 are displayed in association with the CH strip selection buttons 61. In the illustrated example of FIG. 7, the object-of-operation display section 67 displays content based on the layer data La of FIG. 1 as objects of operation of the individual CH strips 30.

On the displayed layer data editing screen 60, the user selects any one of the CH strips 30 as an object of editing by operating any one of the CH strip selection buttons 61*a* to 61*p* and selects an object of operation by performing any one of the buttons 62 to 66.

Figure 8:
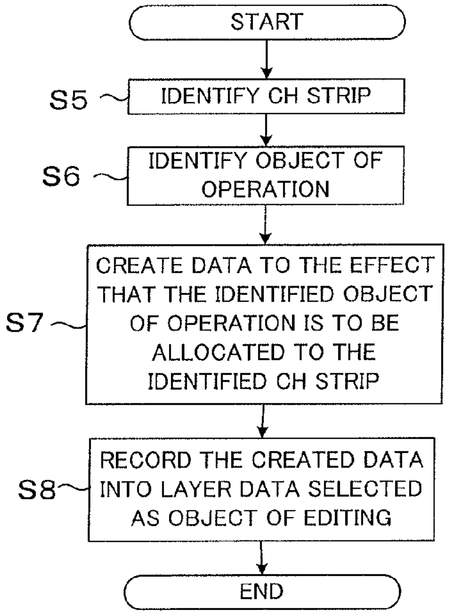
FIG. 8 is a flow chart showing an example of a layer data editing process.

FIG. 8 is a flow chart showing an example of a layer data editing process performed by the CPU 11 in response to a user's layer data editing operation on the layer data editing screen 60. The CPU 11 identifies a CH strip 30 selected by the user at step S5 and an object of operation selected by the user at step S6. At next step S7, the CPU 11 creates data to the effect that the identified object of operation is to be allocated to the identified CH strip 30, and then at step S8, the CPU 11 writes the thus-created data into the layer data L selected as the object of editing. In this manner, the content of the layer data stored as the object of editing in the memory 12 is updated in accordance with the user's editing operation on the layer data editing screen 60. When the user has selected the button 61*a* of "CH Strip 1" and the "Deploying" button 65 on the layer data editing screen 60, for example, the layer data La is updated so as to designate "CH Strip 1" for the "Deploying purpose. Namely, one or more CH strips 30 to be designated for the deployment purpose in each of the layer data L can be readily changed by the user only performing an editing operation on the layer data editing screen 60 of the layer data L.

According to the deployment function of the instant embodiment, as described above, the construction where a group deployment destination is designated per CH strip 30 by the layer data La, Lb, Lc, Ld, . . . permits more flexible selection or designation of CH strips 30 that should become group deployment destinations than the conventionally-known construction where a group deployment destination is designated per block of a plurality of CH strips. Even the small-scale mixer 10, where the CH strips 30 are not divided into blocks, has no substantial limitations on physical structural conditions associated with the group deployment function and can achieve various advantageous benefits, such as the capability of appropriately implementing the group deploying function. Further, it is possible to readily change CH strips 30 to be used as deploying CH strips, by merely collectively switching objects of operation of CH strips 30 through an operation of any one of the layer switches 35*a* to 35*d*.

The following describe example usage of the deployment function of the present invention. Let it be assumed that, in one given layer data La, groups are designated as respective objects of operation of "CH Strip 1" to "CH Strip 8" while "CH Strip 9" to "CH Strip 16" are designated as deploying channel strips. In a state where the layer data La has been selected, individual channels belonging to the groups can be deployed to "CH Strip 9" to "CH Strip 16" by the user merely depressing the SEL switch 33 of each of "CH Strip 1" to "CH Strip 8". Let it also be assumed that, in another given layer data Lb, other groups different from those of the layer data La are designated as respective objects of operation of"CH Strip 1" to "CH Strip 8" and "CH Strip 9" to "CH Strip 16" are designated as deploying channel strips. In this case, individual channels belonging to the groups can be deployed to "CH Strip 9" to "CH Strip 16" by the user merely selecting the layer data Lb and depressing the SEL switch 33 of each of "CH Strip 1" to "CH Strip 8". Let it also be assumed that, in still another given layer data Lc, input channels 20 are designated as respective objects of operation of "CH Strip 1" to "CH Strip 16". In this case, the user is allowed to adjust a parameter value of the input channel 20 in each of "CH Strip 1" to "CH Strip 16" by merely selecting the layer data Lc.

Whereas the present invention has been described above in relation to the preferred embodiment, the present invention is not limited to the above-described preferred embodiment and may be modified variously within the scope of the technical idea disclosed in the appended claims, the specification and the drawings. For example, the instruction for collectively switching the objects of operation of the CH strips 30 may be given in any other desired manner than the one using any one of the layer switches 35; for example, such an instruction may be given via an object-of operation designating screen displayed on the display 36.

Further, groups related to the grouping function of the invention may include a plurality of types of groups, such as a group where values of a plurality of parameters of individual channels belonging to the group are collectively controlled in an interlinked fashion, a group where values of only a portion (some) of parameters of individual channels belonging to the group are collectively controlled in an interlinked fashion, and a group where values of only a mute parameter of individual channels belonging to the group are collectively controlled in an interlinked fashion. Note that the channels may be grouped in any well-known specific manners, i.e. into which types of groups the channels should be grouped may be determined according to any desired one of the well-known specific manners.

Furthermore, the application of the audio signal processing apparatus of the present invention is not limited to hardware mixers like the above-described mixer 10, and the audio signal processing apparatus of the present invention is also applicable to mixers virtually implemented by software programs, for example, in personal computers. Furthermore, the basic principles of the present invention may be applied to any audio signal processing devices and apparatus, such as multichannel recording devices, rather than being limited to audio mixers.

This application is based on, and claims priority to, JP PA 2015-061639 filed on 24 Mar. 2015 . The disclosure of the priority application, in its entirety, including the drawings, claims, and the specification thereof, are incorporated herein by reference.

What is claimed is:

1. An audio signal processing apparatus for performing signal processing on audio signals input to a plurality of channels, comprising:

a plurality of channel strips, each of the plurality of channel strips including at least one manual operator for adjusting a parameter value of signal processing to be performed on one of the channels or a group of two or more of the channels allocated to the channel strip as an object of operation;

a memory storing object-of-operation designation information that designates objects of operation to be allocated to individual ones of the plurality of channel strips, wherein, for each of the plurality of channel strips, the object-of-operation designation information designates the channel or the group of two or more of the channels as the object of operation of the channel strip, or designates one or more of the channel strips as one or more deploying channel strips for individually deploying thereto any one of the channels belonging to the group of two or more of the channels;

a storage medium storing a program; and a processor for executing the program, the processor, when executing the program, being configured to:

based on the object-of-operation designation information stored in the memory, allocate, to the plurality of channel strips, the channels or the group of two or more of the channels designated as the objects of operation, wherein the processor allocates none of the channels or the group of two or more of the channels to the one or more of the channel strips designated as the one or more deploying channel strips and makes a setting to an effect that each of the one or more of the channel strips designated as the deploying channel strip is to be used as the deploying channel strip; and in response to a deploying instruction of a given group of two or more of the channels, allocate individual one or more channels belonging to the given group of two or more of the channels to the one or more of the channel strips designated as the one or more deploying channel strips.

2. The audio signal processing apparatus according to claim 1, wherein the memory stores a plurality of pieces of the object-of-operation designation information, and wherein, based on a selected one the plurality of pieces of the object-of-operation designation information, the processor allocates, to the plurality of channel strips, the channels or the group of two or more of the channels designated as the objects of operation, but allocates none of the channels or the group of two or more of the channels to the one or more of the channel strips designated as the one or more deploying channel strips.

3. The audio signal processing apparatus according to claim 1, wherein the processor, when executing the program, is configured to edit the object-of-operation designation information in response to a user's operation, and wherein the memory stores the object-of-operation designation information having been edited in response to the user's operation.

4. An audio signal processing apparatus for performing signal processing on audio signals input to a plurality of channels, comprising:

a plurality of channel strips, each of the plurality of channel strips including at least one manual operator for adjusting a parameter value of signal processing to be performed on one of the channels or a group of two or more of the channels allocated to the channel strip as an object of operation;

a storage section storing object-of-operation designation information that designates objects of operation to be allocated to individual ones of the plurality of channel strips, wherein, for each of the plurality of channel strips, the object-of-operation designation information designates the channel or the group of two or more of the channels as the object of operation of the channel strip, or designates one or more of the channel strips as one or more deploying channel strips for individually deploying thereto any one of the channels belonging to the group of two or more of the channels;

a first allocation section that, based on the object-of-operation designation information stored in the storage section, allocates objects of operation to the plurality of channel strips, and that allocates none of the channels or the group of two or more of the channels to the one or more of the channel strips designated as the one or more deploying channel strips and makes a setting to an effect that each of the one or more of the channel strips designated as the deploying channel strip is to be used as the deploying channel strip; and a second allocation section that, in response to a deploying instruction of a given group of two or more of the channels, allocates individual one or more channels belonging to the given group of two or more of the channels to the one or more of the channel strips designated as the one or more deploying channel strips by the object-of-operation designation information.

5. A method for allocation to channel strips in an audio signal processing apparatus for performing signal processing on audio signals input to a plurality of channels, the audio signal processing apparatus including a plurality of channel strips each including an operator for adjusting a parameter value of signal processing to be performed on one of the channels or a group of two or more of the channels allocated to the channel strip as an object of operation, the method comprising:

preparing object-of-operation designation information that designates objects of operation to be allocated to individual ones of the plurality of channel strips, wherein, for each of the plurality of channel strips, the object-of-operation designation information designates the channel or the group of two or more of the channels as the object of operation of the channel strip, or designates one or more of the channel strips as one or more deploying channel strips for individually deploying thereto any one of the channels belonging to the group of two or more of the channels;

allocating objects of operation to the plurality of channel strips based on the prepared object-of-operation designation information, wherein, for each channel strip designated as the deploying channel strip, a setting is made to an effect that the channel strip designated as the deploying channel strip is to be used as the deploying channel strip without any channel or group of two or more of the channels being allocated to the channel strip designated as the deploying channel strip; and allocating, in response to a deploying instruction of a given group of two or more of the channels, individual channels belonging to the given group of two or more of the channels to the one or more channel strips designated as the one or more deploying channel strips.

6. The method as claimed in claim 5, wherein the preparing object-of-operation designation information includes storing the object-of-operation designation information into a memory.

7. A non-transitory storage medium containing a group of instructions for causing a processor to perform a method for allocation to channel strips in an audio signal processing apparatus for performing signal processing on audio signals input to a plurality of channels, the audio signal processing apparatus including a plurality of channel strips each including an operator for adjusting a parameter value of signal processing to be performed on one of the channels or a group of two or more of the channels allocated to the channel strip as an object of operation, the method comprising:

preparing object-of-operation designation information that designates objects of operation to be allocated to individual ones of the plurality of channel strips, wherein, for each of the plurality of channel strips, the object-of-operation designation information designates the channel or the group of two or more of the channels as the object of operation of the channel strip, or designates one or more of the channel strips as one or more deploying channel strips for individually deploying thereto any one of the channels belonging to the group of two or more of the channels;

allocating objects of operation to the plurality of channel strips based on the prepared object-of-operation designation information, wherein, for each channel strip designated as the deploying channel strip, a setting is made to an effect that the channel strip designated as the deploying channel strip is to be used as the deploying channel strip without any channel or group of two or more of the channels being allocated to the channel strip designated as the deploying channel strip; and allocating, in response to a deploying instruction of a given group of two or more of the channels, individual channels belonging to the given group of two or more of the channels to the one or more channel strips designated as the one or more deploying channel strips.

* * * * *